United States Patent
Braunisch et al.

(10) Patent No.: US 11,581,272 B2
(45) Date of Patent: Feb. 14, 2023

(54) CONTACTLESS HIGH-FREQUENCY INTERCONNECT

(71) Applicant: Intel Corporation, Santa Clara, CA (US)

(72) Inventors: Henning Braunisch, Phoenix, AZ (US); Adel A. Elsherbini, Chandler, AZ (US); Georgios Dogiamis, Chandler, AZ (US); Telesphor Kamgaing, Chandler, AZ (US); Richard Dischler, Bolton, MA (US); Johanna M. Swan, Scottsdale, AZ (US); Victor J. Prokoff, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 781 days.

(21) Appl. No.: 16/394,537

(22) Filed: Apr. 25, 2019

(65) Prior Publication Data

US 2020/0303328 A1 Sep. 24, 2020

(30) Foreign Application Priority Data

Mar. 22, 2019 (GR) .............................. 20190100132

(51) Int. Cl.
*H01L 23/66* (2006.01)
*H01L 23/538* (2006.01)
*H01L 25/065* (2006.01)
*H01L 23/00* (2006.01)

(52) U.S. Cl.
CPC .......... *H01L 23/66* (2013.01); *H01L 23/5385* (2013.01); *H01L 23/5386* (2013.01); *H01L 24/10* (2013.01); *H01L 24/94* (2013.01); *H01L 25/0657* (2013.01); *H01L 2225/06513* (2013.01)

(58) Field of Classification Search
CPC ...................................................... H01L 23/66
See application file for complete search history.

(56) References Cited

U.S. PATENT DOCUMENTS

2013/0265734 A1 10/2013 Herbsommer et al.

FOREIGN PATENT DOCUMENTS

| CN | 111725200 A | 9/2020 | |
|---|---|---|---|
| EP | 1667227 A1 | 6/2006 | |
| GB | 2565310 A | 2/2019 | |
| WO | 2018236336 A1 | 12/2018 | |
| WO | WO-2018236336 A1 * | 12/2018 | ......... H01L 21/4857 |

OTHER PUBLICATIONS

Extended European Search Report in European Application No. 20156735.1 dated Jul. 2, 2020, 9 pages.

* cited by examiner

*Primary Examiner* — William A Harriston
(74) *Attorney, Agent, or Firm* — Akona IP PC (57) ABSTRACT

Embodiments may relate to a multi-chip microelectronic package that includes a first die and a second die coupled to a package substrate. The first and second dies may have respective radiative elements that are communicatively coupled with one another such that they may communicate via an electromagnetic signal with a frequency at or above approximately 20 gigahertz (GHz). Other embodiments may be described or claimed.

20 Claims, 7 Drawing Sheets

Coupling a first die to a package substrate, wherein the first die has a first radiative element that is to emit an electromagnetic signal with a frequency of at least 20 GHz
605

Coupling a second die to the package substrate adjacent to the first die, wherein the second die has a second radiative element that is to receive the electromagnetic signal, and wherein the first radiative element and the second radiative element are not directly physically coupled with one another
610

Figure 6

CONTACTLESS HIGH-FREQUENCY INTERCONNECT

CROSS REFERENCE TO RELATED APPLICATIONS

This application claims priority to Greek Patent Application No. 20190100132 filed Mar. 22, 2019 and entitled "CONTACTLESS HIGH-FREQUENCY INTERCONNECT", which is hereby incorporated by reference in its entirety herein.

BACKGROUND

Flip-chip packaging may be considered a powerful technology for constructing high-performance multi-chip packages (MCPs) with high die-to-die bandwidth density.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted above, flip-chip packaging may be considered a powerful technology for constructing high-performance MCPs with high die-to-die bandwidth density. Embodiments herein may relate to leveraging emerging high-frequency transceiver circuitry to increase MCP die-to-die bandwidth density without adding routing layers to the package substrate.

As used herein, high-frequency signals may relate to signals with a frequency of approximately 20 gigahertz (GHz) or above. For example, some high-frequency signals may have a frequency of between approximately 20 GHz and approximately 300 GHz, and be considered millimeter-wave (mmWave) signals. Other high-frequency signals may have a frequency greater than approximately 300 GHz, for example on the order of 1 terahertz (THz) or above, and be considered THz-wave signals. Some high-frequency signals may generally have a frequency between approximately 20

GHz and approximately 10 THz, though other high-frequency signals may have a greater or lower frequency in some embodiments.

More specifically, in some embodiments herein, flip-chip dies on an MCP may be connected edge-to-edge by placing a radiative element on each die, and bringing the die edges in close proximity to one another so that the radiative elements can communicate with one another without the dies (or the radiative elements) physically touching. Examples of radiative elements may include putting a half of a capacitor, transformer, directional coupler, antennas, wave launchers, or some other type of radiative element pairing. In this manner, without making galvanic contact, signaling may be accomplished across the gap between the dies by using high-frequency transceiver circuits on the dies that are able to transmit the high-frequency signal through a radiative element of one die, where it may be received by the radiative element of another die. In some embodiments, non-rectangular dies may be used to increase available die periphery and isolation between signaling lanes. Some embodiments may be used in side-by-side dies, whereas other embodiments may be used in stacked dies.

Generally, embodiments may open up new three-dimensional (3-D) pathways for die-to-die signaling in addition to what may be available in conventional flip-chip packaging. Thus, die-to-die bandwidth density may be increased without adding routing layers to the package substrate. Additionally, not making galvanic contact edge-to-edge (e.g., such that the dies directly contact one another in the MCP) may facilitate assembly of the MCP. Additionally, some embodiments may include non-rectangular dies with meandering edges, as will be described in greater detail below, which may enable increased isolation between signaling lanes.

Figure 1:
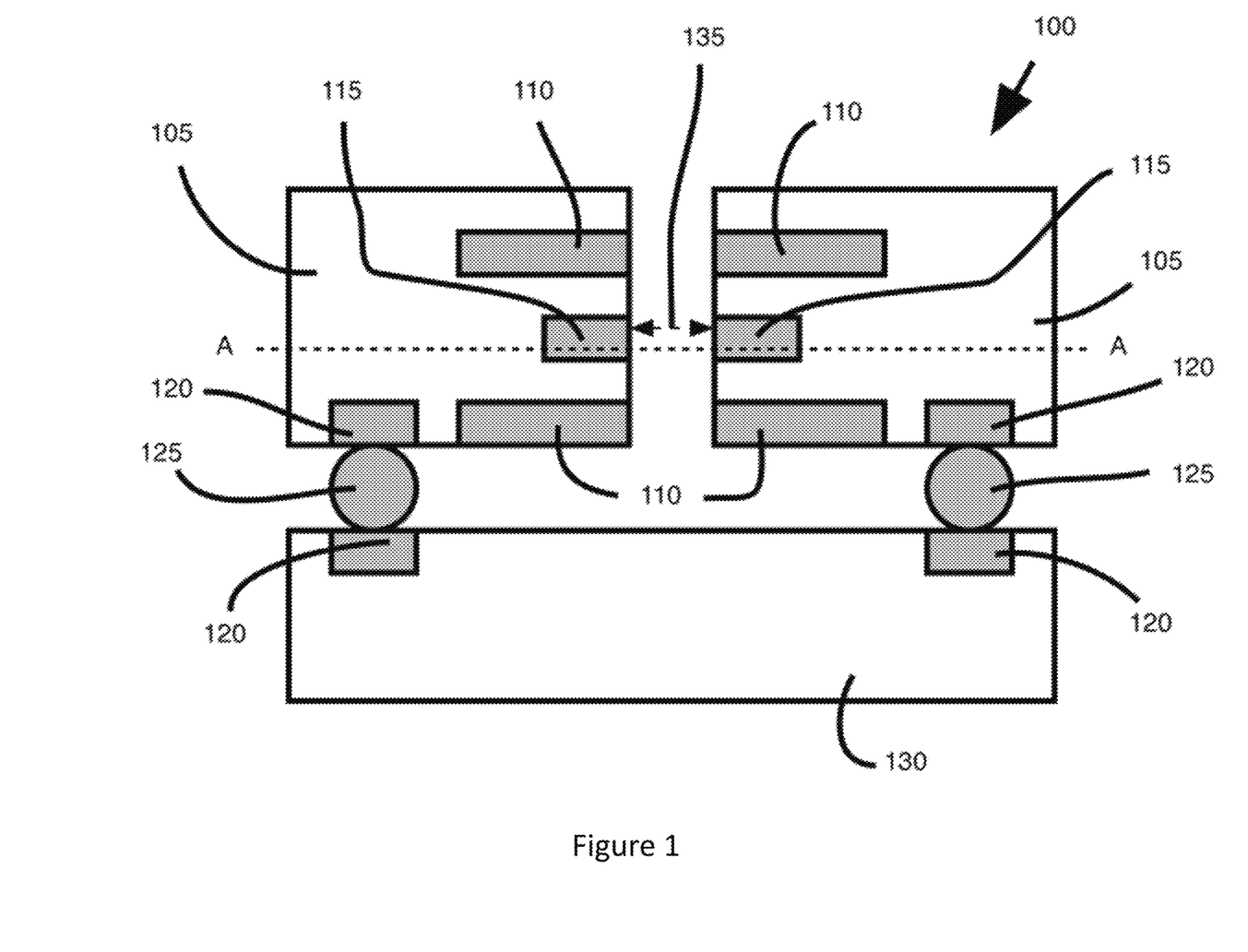
FIG. 1 illustrates an example MCP, in accordance with embodiments herein.

FIG. 1 illustrates an example MCP, in accordance with embodiments herein. Specifically, FIG. 1 may depict an MCP with two flip-chip dies that have edges that are in close proximity to one another, but are not touching. Waveguides such as striplines may be routed on each die to form an electromagnetic coupling region that extends from one die to the other. In other words, the striplines may act as radiative elements that may, together, form a directional coupler. However, as will be discussed below, in other embodiments other radiative elements may be used.

More specifically, FIG. 1 depicts an MCP 100. The MCP 100 may include two dies 105. The dies 105 may be considered to be "flip-chip" type dies based on their method of attachment to a package substrate 130, however in other embodiments a different type of attachment mechanism for the die may be used rather than the flip-chip mechanism used for one or both of the dies 105. In embodiments, the one or both of the dies 105 may be a processor such as a central processing unit (CPU), a general processing unit (GPU), a core of a distributed processor, or some other type of processor. Additionally or alternatively, one or both of the dies 105 may be a memory such as a non-volatile memory (NVM), a flash memory, a double data rate (DDR) memory, a random access memory (RAM), or some other type of memory. Additionally or alternatively, one or both of the dies 105 may be or include RF circuitry designed to generate or process one or more signals in accordance with a wireless standard such as a second generation (2G) standard, a third generation (3G) standard, a fourth generation (4G) standard, a fifth generation (5G) standard, a Wi-Fi standard, a Bluetooth standard, a WiGig standard, or some other wireless standard known or hereinafter developed. In other embodiments, one or both of the dies 105 may be some other type of die.

The package substrate 130 may be a cored or coreless substrate, and may include one or more dielectric layers of an organic or inorganic material. For example, the package substrate 130 may be made of, or comprise, one or more layers of a material such as a build-up film (BUF). In some embodiments, the package substrate 130 may also include one or more conductive elements such as vias, traces, pads, etc. which may not be shown in FIG. 1 for the sake of clarity of the Figure. Specifically, the conductive elements may route one or more data or power signals between different parts of the package substrate 130, different elements coupled with the package substrate 130, or elements within the package substrate 130. In some embodiments, the package substrate 130 may include one or more additional elements such as a die, passive elements like a resistor or capacitor, or some other element either coupled with or within the package substrate 130. These additional elements are likewise not shown for the sake of clarity of FIG. 1.

The dies 105 may be coupled with the package substrate 130 by interconnects which may include pads 120 and solder bumps 125. Specifically, as shown, both the dies 105 and the package substrate 130 may include pads 120. The pads 120 may be formed of a conductive material such as copper, gold, or some other conductive material or combination of conductive materials. Although the pads 120 are depicted as being generally flush with the surface of the dies 105 and the package substrate 130, in some embodiments the pads 120 may not be flush with the surface of one or both of the dies 105, the package substrate 130, or some combination thereof. For example, in some embodiments the pads 120 may at least partially protrude from the face of a die 105 or the package substrate 130.

Similarly, the solder bumps 125 may be formed of a solder material which may both physically and communicatively couple the pads 120 to one another. It will be understood, however, that in some embodiments one or more of the pads 120, the solder bumps 125, or some combination thereof may be replaced by a different type of interconnect. For example, in some embodiments the solder bumps 125 may be elements of a ball grid array (BGA). However, in other embodiments the solder bumps 125 may be replaced by pins of a pin grid array (PGA), elements of a land grid array (LGA), a socket mechanism, or some other type of interconnect.

The dies 105 may each include a radiative element 115 which may establish a communication path 135. Specifically, the radiative element 115 may be configured to electromagnetically transmit a high-frequency signal from one radiative element 115 of one die 105 to another radiative element 115 of another die. In some embodiments, the radiative elements may each be a plate or other element of a capacitor or portions of a transformer such that a charge supplied to one radiative element of one die 105 creates a corresponding change in charge of the radiative element of the other die 105. In some embodiments, the radiative elements 115 may be a stripline as depicted in FIG. 1. Specifically, the radiative elements 115 may be a trace that is nestled between two ground traces 110 of the die. In this embodiment, the radiative elements 115 may, together, form a directional coupler as will be described in greater detail below.

Figure 2:
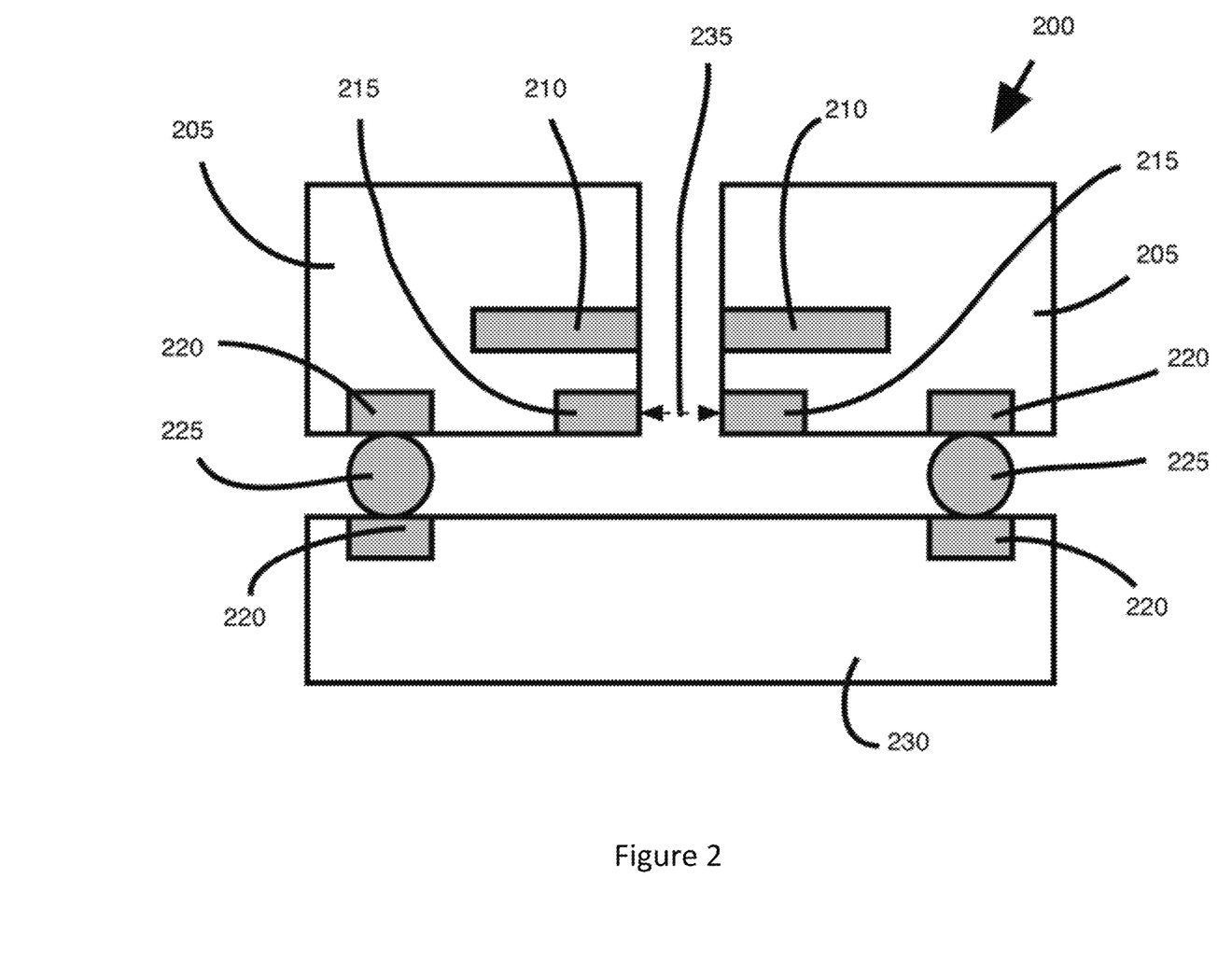
FIG. 2 illustrates an alternative example MCP, in accordance with embodiments herein.

FIG. 2 illustrates an alternative example MCP 200, in accordance with embodiments herein. Generally, the MCP 200 may have elements similar to those of MCP 100.

Specifically, the MCP 200 may include dies 205, package substrate 230, pads 220, and solder bumps 225, which may be respectively similar to, and share characteristics of, dies 105, package substrate 130, pads 120, and solder bumps 125.

The dies 205 may further have ground planes 210 and radiative elements 215, which may be similar to, and share one or more characteristics of, ground planes 110 and radiative elements 115. However, as can be seen, the radiative elements 215 may be located at an external portion of the dies 205. In these embodiments, the radiative elements 215 may be microstrips rather than striplines, and the microstrips may together form a directional coupler. However, it will be understood that in other embodiments the radiative elements 215 may be halves of a capacitor, elements of a transformer, antennae, etc. Generally, the radiative elements 215 may establish a communication path 235, which may be similar to, and share one or more characteristics of, communication path 135.

Figure 3:
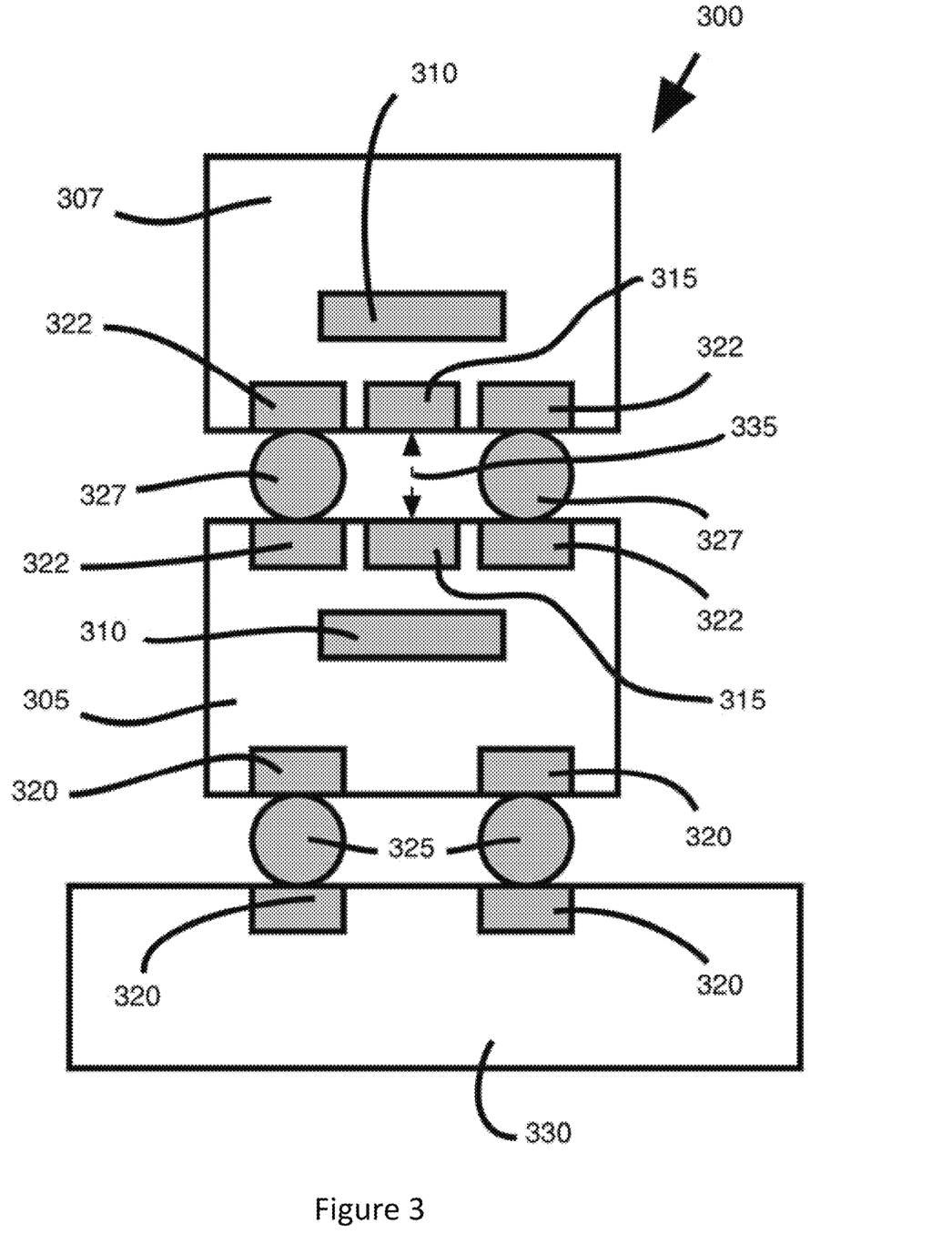
FIG. 3 illustrates an alternative example MCP, in accordance with embodiments herein.

FIG. 3 illustrates an alternative example MCP 300, in accordance with embodiments herein. Specifically, the MCP 300 may include a die 305, package substrate 330, pads 320, and solder bumps 325 which may be respectively similar to, and share one or more characteristics of, die 105, package substrate 130, pads 120, and solder bumps 125. Die 305 may additionally include a ground plane 310 and a radiative element 315 which may be similar to, and share one or more characteristics of, ground plane 110 and radiative element 115.

The MCP 300 may include a second die 307 which may be generally similar to, and share one or more characteristics of, die 105. The die 307 may also include a ground plane 310 and a radiative element 315. The radiative elements 315 may form a communication path 335 which may be similar to, and share one or more characteristics of, communication path 135.

As can be seen in FIG. 3, rather than both dies 305 and 307 being coupled directly with the package substrate 330, die 307 may be coupled with die 305 such that die 305 is positioned at least partially between die 307 and the package substrate 330. Specifically, dies 305 and 307 may include pads 322, which may be similar to, and share one or more characteristics of, pads 120. Similarly, the dies 305 and 307 may be coupled by solder bumps 327, which may be similar to, and share one or more characteristics of, solder bumps 125.

It will be understood that the various embodiments of FIGS. 1-3 are intended as examples of concepts, and other embodiments may include one or more variations from those shown in FIGS. 1-3. For example, with respect to FIG. 3, although the solder bumps 327 are depicted as having a similar size and pitch to solder bumps 325, in other embodiments the solder bumps 327 may be larger or smaller, or have a greater or smaller pitch, than solder bumps 325. Additionally, in some embodiments the die 307 may be offset from die 305 rather than directly stacked on top of die 305 as shown. In some embodiments, the die 307 may be physically or communicatively coupled directly to both the die 305 and the package substrate 330 (for example by having a non-rectangular shape, extended interconnects, etc.)

Similarly, although certain elements may be shown as generally rectangular or flush with other elements (e.g., how various of the pads 120/220/etc. are shown as flush with the sides of the various dies 105/205/etc.), in other embodiments elements may at least partially protrude from, or be located fully on the exterior of, the elements in which they are shown as embedded. As another example, in some embodiments the radiative elements 115/215/etc. or the ground planes 110/210/etc. may at least partially protrude from, or be located fully on the exterior of, dies 105/205/etc.

Additionally, it will be understood that the number, location, sizes, etc. of certain elements depicted in FIGS. 1-3 is intended as an example. For example, there may be more or fewer interconnects, radiative elements, ground planes, etc. than shown. In some embodiments different elements may be different sizes than depicted with respect to other elements of the Figures. The locations of certain elements such as the interconnects may be different in different embodiments. In some embodiments the microstrips such as those depicted in FIG. 2 may be located at a different face of the die than is depicted in FIG. 2 (e.g., at a face of the die 205 that is not adjacent to the package substrate 230). Other variations may be present in other embodiments.

Figure 4:
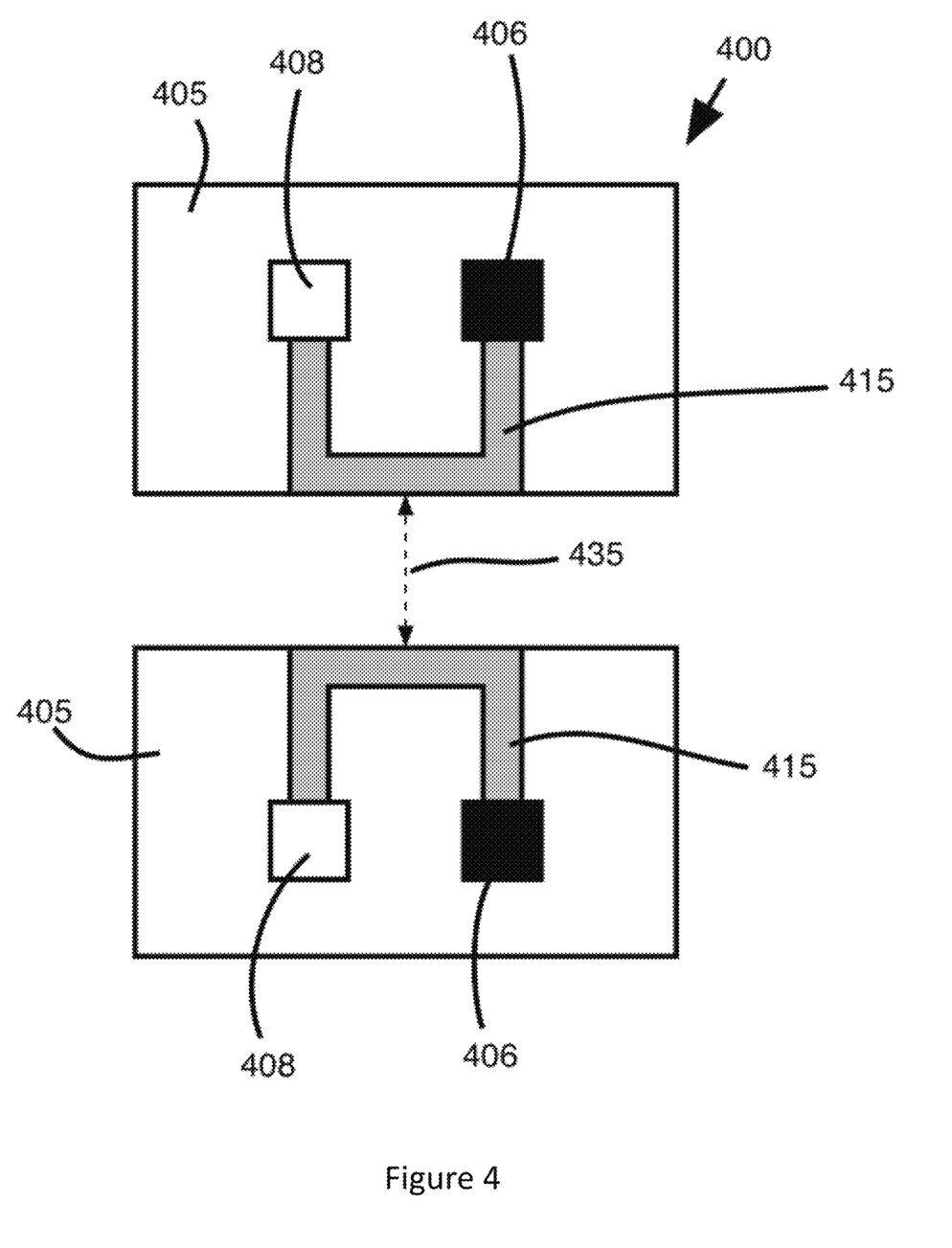
FIG. 4 illustrates a top-down cutaway portion of an example MCP with a directional coupler, in accordance with embodiments herein.

FIG. 4 depicts an example of how a directional coupler may be used for contactless die-to-die signaling. One port on each die may be connected to a mmWave or a THz-wave transceiver, transmitter, or receiver. Data may originate from a transmitter (or a transmitter element of a transceiver), and arrive at a receiver (or a receiver element of a transceiver). The other port on each die may be terminated on-die, e.g., using a thin-film resistor made of polysilicon.

Generally, FIG. 4 may be considered to illustrate a top-down cutaway portion of an example MCP 400 with a directional coupler, in accordance with embodiments herein. Such an MCP 400 may be similar to, for example, MCP 100, and the view of FIG. 4 may be along line A-A of FIG. 1.

The MCP 400 may include two dies 405, which may be similar to, and share one or more characteristics of, dies 105. The dies 405 may have radiative elements 415, which may be similar to, and share one or more characteristics of, radiative elements 115. As depicted in FIG. 4, the radiative elements 415 may be striplines. Specifically, the radiative elements 415 may be waveguides that are embedded between two layers of a dielectric material of the dies 405. It will be understood, however, that in other embodiments one or both of the radiative elements 415 may be a microstrip such that the radiative element 415 is only coupled to the dielectric material of the dies 405 on one side of the radiative element 415.

The radiative elements 415 may be coupled with a transceiver 408. In embodiments, the transceiver 408 may have transmitter functionality that is to generate and transmit a high-frequency signal along the radiative element 415. Similarly, the transceiver 408 may have receiver functionality that is to identify and process a high-frequency signal received from a radiative element 415. In some embodiments, the transceiver 408 may have both transmitter and receiver functionality, whereas in other embodiments the transceiver 408 may not have transmitter functionality (i.e., it may be a "receiver") or it may not have receiver functionality (i.e., it may be a "transmitter").

The radiative elements 415 may also be coupled with a termination 406. The termination 406 may be, for example, a thin-film resistor or some other termination. In some embodiments the termination 406 may be made of polysilicon or some other material.

In operation a directional coupler may operate such that a signal generated in one arm of the directional coupler (e.g., a radiative element 415 of one die 405) may cause a similar signal in the other arm of the directional coupler (e.g., the radiative element 415 of the other die 405). Therefore, a transceiver 408 may transmit a high-frequency signal along one radiative element 415. The radiative elements 415 may together form a communication path 435, which may be similar to, and share one or more characteristics of, communication path 135. Therefore, the high-frequency signal may be picked up by the radiative element 415 of the other die 405, and then be communicated to a transceiver 408 for identification and processing. In this manner, the dies 405 may be able to communicate to one another using high-frequency signals, even if the dies 405 are adjacent to one another but not directly touching. It will be noted that the embodiment of FIG. 4 is intended as one example embodiment, and similarly to as described above with respect to FIGS. 1-3, other embodiments may have more or fewer elements than depicted in FIG. 4, or the elements may be different sizes, shapes, etc.

Some embodiments may improve contactless signaling across die edges by increasing isolation between signaling lanes, and thereby reducing crosstalk. Mating meandering die edges obtained by, for example, laser dicing (including stealth dicing) or plasma dicing before or after grind may be used to increase the distance between neighboring coupling regions. This mating may increase isolation, reduce crosstalk, and lead to higher bandwidth density or better power efficiency.

Figure 5:
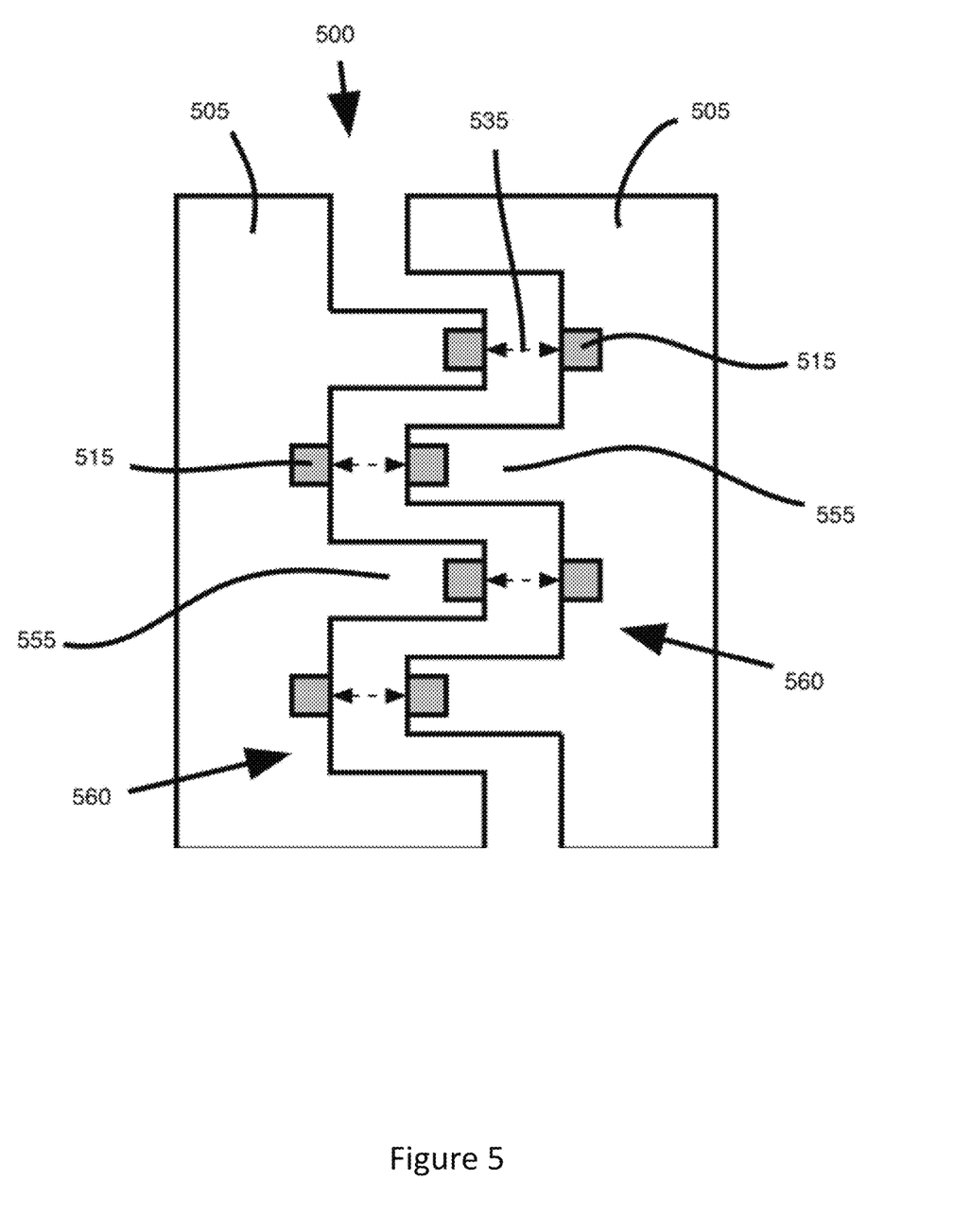
FIG. 5 illustrates an example cutaway view of a portion of an example MCP, in accordance with embodiments herein.

FIG. 5 depicts an example cutaway view of a portion of an example MCP 500, in accordance with embodiments herein. Similarly to FIG. 4, the cutaway view of FIG. 5 may be along line A-A of FIG. 1. Each and every element of FIG. 5 may not be explicitly numbered for the sake of clarity of the Figure. However, it will be understood that certain un-numbered elements may share characteristics with similar numbered elements.

The MCP 500 may be generally similar to MCP 100. Specifically, the MCP 500 may include dies 505, which may be similar to, and share one or more characteristics of, dies 105. The dies 105 may have a plurality of radiative elements 515 which may be similar to, and share one or more characteristics of, radiative elements 115. The radiative elements 515 of one die 505 may form a communication path 535 with the radiative elements 515 of the other die 505. The communication path 535 may be similar to, and share one or more characteristics of, communication path 135.

However, as can be seen in FIG. 5, facing sides of the dies 505 may have "meandering" die edges. Specifically, each die may have one or more protrusions 555 and one or more cavities 560. The protrusion(s) 555 of one die 505 may be positioned within the cavity or cavities 560 of the other die 505. In this manner, the dielectric material of the dies 505 may help to isolate the communication paths 535 from one another, which may increase isolation and reduce crosstalk between the communication paths 535, thereby increasing bandwidth density or increasing power efficiency.

Figure 6:
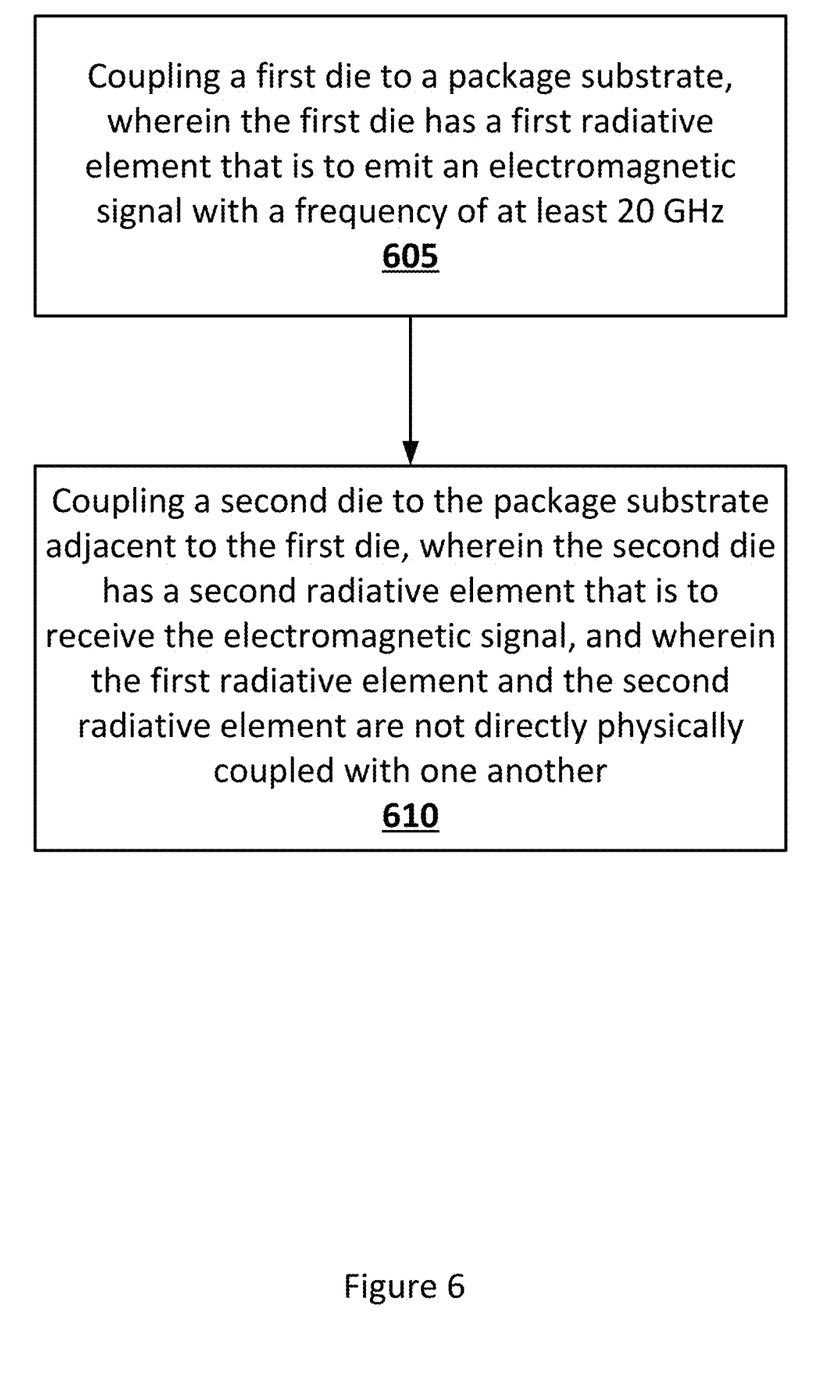
FIG. 6 illustrates an example technique for generating an MCP, in accordance with embodiments herein.

FIG. 6 illustrates an example technique for generating an MCP, in accordance with embodiments herein. Generally, FIG. 6 may be described with respect to the MCP 100 of FIG. 1, however it will be understood that the description may be adapted, in whole or in part, with or without modification, to other embodiments of this disclosure.

The technique may include coupling, at 605, a first die to a package substrate. The die may be similar to die 105, and the package substrate may be similar to package substrate 130. The die may have a first radiative element, which may be similar to radiative element 115. The radiative element may be configured to emit an electromagnetic signal with a frequency of at least 20 GHz. More generally, the electromagnetic signal may be a high-frequency electromagnetic signal as described above.

The technique may further include coupling, at 610, a second die to the package substrate adjacent to the first die. The second die may likewise be similar to die 105. The second die may have a second radiative element which may be similar to radiative element 115. The second radiative element may receive the electromagnetic signal as described above. As can be seen in the Figures, the first radiative element may not be directly physically coupled with the second radiative element.

It will be noted that, in other embodiments, the first die may be similar to die 305, and the second die may be similar to die 307 (or vice versa). In this embodiment, the dies may still be considered to be adjacent to one another, however one die may be located between the package substrate and the other die. It will also be understood that in some embodiments element 610 may occur prior to element 605, or elements 605 and 610 may occur concurrently with one another.

Figure 7:
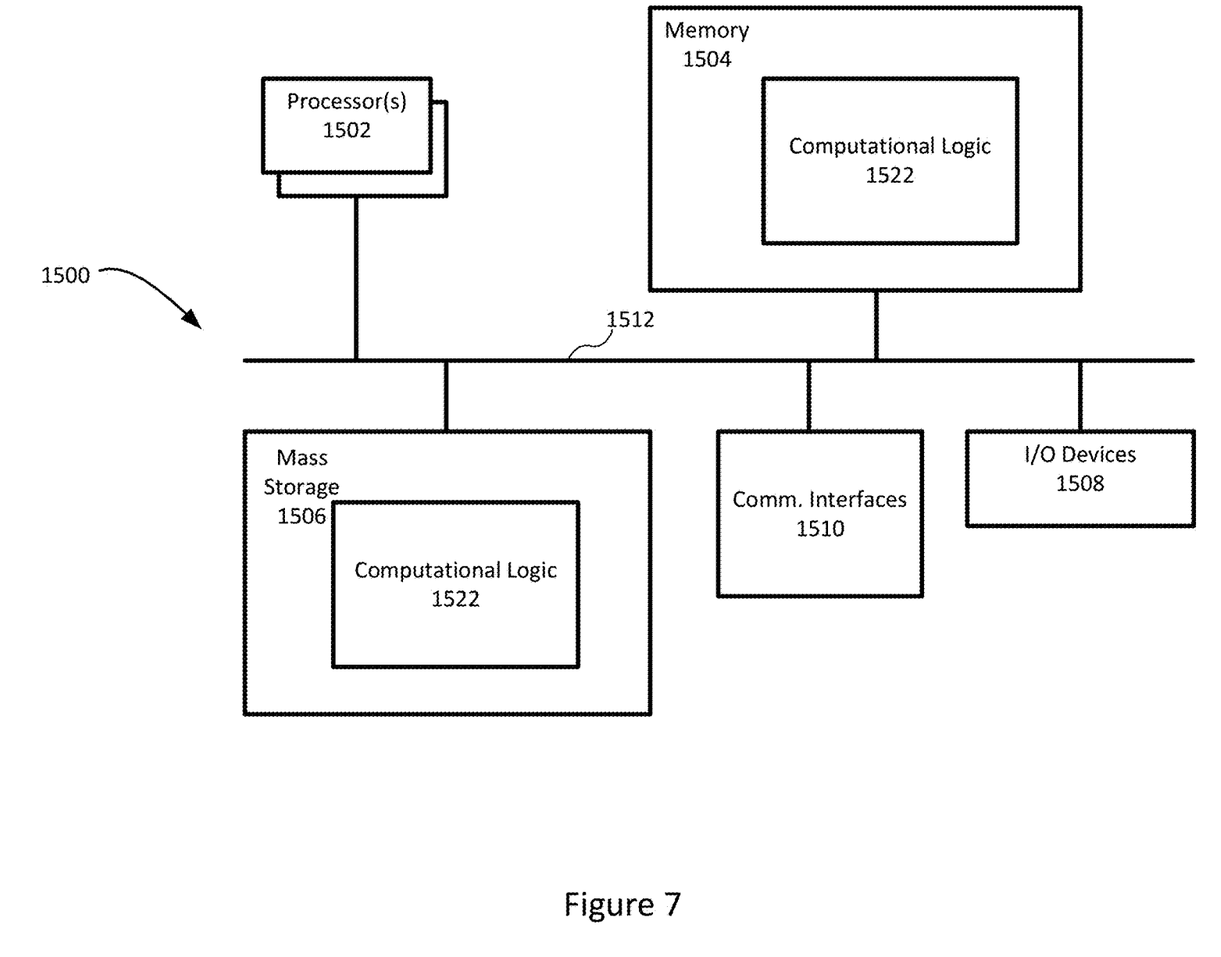
FIG. 7 illustrates an example device that may use various embodiments herein, in accordance with various embodiments.

FIG. 7 illustrates an example computing device 1500 suitable for use with MCPs 100, 200, 300, 400, 500, or some other MCP that is in accordance with this disclosure. Specifically, in some embodiments, the computing device 1500 may include one or more of the MCPs therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more down-converters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of the various MCPs 100, 200, 300, 400, 500, or some other MCP that is in accordance with this disclosure. For example, a die such as dies 105, 205, 305, 405, 505, or some other die in accordance with this disclosure may, in some embodiments, be a processor 1502, memory 1504, or some other component of the computing device 1500.

EXAMPLES OF VARIOUS EMBODIMENTS

Example 1 includes a multi-chip microelectronic package comprising: a package substrate; a first die physically coupled with the package substrate, wherein the first die includes a first radiative element; and a second die coupled with the package substrate, wherein the second die has a second radiative element that is communicatively coupled with the first radiative element such that the first die may transmit an electromagnetic signal with a frequency of at least 20 gigahertz (GHz) from the first radiative element to the second radiative element.

Example 2 includes the multi-chip microelectronic package of example 1, wherein the first die is directly physically coupled with the package substrate, and the second die is directly physically coupled with the first die.

Example 3 includes the multi-chip microelectronic package of example 1, wherein the first radiative element is located at an outer surface of the first die.

Example 4 includes the multi-chip microelectronic package of example 1, wherein the first radiative element is located between two dielectric layers of the first die.

Example 5 includes the multi-chip microelectronic package of any of examples 1-4, wherein the first radiative element is not physically coupled with the second radiative element.

Example 6 includes the multi-chip microelectronic package of any of examples 1-4, wherein a face of the first die that is adjacent to the second die has a non-planar profile.

Example 7 includes the multi-chip microelectronic package of example 6, wherein a face of the second die that is adjacent to the face of the first die has a non-planar profile.

Example 8 includes the multi-chip microelectronic package of example 6, wherein the face of the first die includes one or more cavities.

Example 9 includes the multi-chip microelectronic package of example 8, wherein the face of the second die includes one or more protrusions that are to mate with the one or more cavities of the first die.

Example 10 includes an electronic device comprising: a first die with a first radiative element that is to transmit an electromagnetic signal with a frequency of at least 20 gigahertz (GHz); and a second die with a second radiative element, wherein the second die is positioned adjacent to the first die and wherein the second radiative element is to receive the electromagnetic signal from the first die.

Example 11 includes the electronic device of example 10, wherein the first die and the second die are coupled with a package substrate.

Example 12 includes the electronic device of example 10, wherein the first die is coupled with the second die, and the second die is coupled with a package substrate.

Example 13 includes the electronic device of any of examples 10-12, wherein the first radiative element and the second radiative element are a directional coupler.

Example 14 includes the electronic device of any of examples 10-12, wherein the first radiative element and the second radiative element are a capacitor or a transformer.

Example 15 includes the electronic device of any of examples 10-12, wherein the first radiative element is a first antenna and the second radiative element is a second antenna.

Example 16 includes a method of manufacturing a multi-chip microelectronic package, the method comprising: coupling a first die to a package substrate, wherein the first die has a first radiative element that is to emit an electromagnetic signal with a frequency of at least 20 gigahertz (GHz); and coupling a second die to the package substrate adjacent to the first die, wherein the second die has a second radiative element that is to receive the electromagnetic signal, and wherein the first radiative element and the second radiative element are not directly physically coupled with one another.

Example 17 includes the method of example 16, wherein: coupling the first die to the package substrate includes physically coupling the first die directly to the package substrate; and coupling the second die to the package substrate includes physically coupling the second die directly to the package substrate.

Example 18 includes the method of example 16, wherein coupling the second die to the package substrate includes physically coupling the second die to the first die such that the first die is positioned between the package substrate and the second die.

Example 19 includes the method of any of examples 16-18, wherein the electromagnetic signal has a frequency of at least 300 GHz.

Example 20 includes the method of any of examples 16-18, wherein the electromagnetic signal has a frequency of at least 1 terahertz (THz).

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A multi-chip microelectronic package comprising:
   a package substrate having a first surface;
   a first die having a second surface, an opposing third surface, and a first lateral surface extending between the second and third surfaces, wherein the second surface of the first die is physically coupled with the first surface of the package substrate, wherein the first die includes a first radiative element; and
   a second die having a fourth surface, an opposing fifth surface, and a second lateral surface extending between the fourth and fifth surfaces, wherein the fourth surface of the second die is physically coupled with the first surface of the package substrate, wherein the second lateral surface of the second die faces the first lateral surface of the first die, wherein the second die has a second radiative element that is communicatively coupled by a communication path with the first radiative element, wherein the communication path is parallel to the first surface of the package substrate between the first lateral surface of the first die and the second lateral surface of the second die, and wherein the first die is configured to transmit an electromagnetic signal with a frequency of at least 20 gigahertz (GHz) from the first radiative element to the second radiative element.

2. The multi-chip microelectronic package of claim 1, wherein the first radiative element is located at the second surface of the first die.

3. The multi-chip microelectronic package of claim 1, wherein the first radiative element is located between two dielectric layers of the first die.

4. The multi-chip microelectronic package of claim 1, wherein the first radiative element is not physically coupled with the second radiative element.

5. The multi-chip microelectronic package of claim 1, wherein a face the first lateral surface of the first die has a non-planar profile.

6. The multi-chip microelectronic package of claim 5, wherein a face the second lateral surface of the second die has a non-planar profile.

7. The multi-chip microelectronic package of claim 5, wherein the first lateral surface of the first die includes one or more cavities.

8. The multi-chip microelectronic package of claim 7, wherein the second lateral surface of the second die includes one or more protrusions that mate with the one or more cavities of the first die.

9. The multi-chip microelectronic package of claim 8, wherein the first radiative element is one of a plurality of first radiative elements, the second radiative element is one of a plurality of second radiative elements, and the communication path is one of a plurality of communication paths.

10. An electronic device comprising:
    a package substrate having a surface;
    a first die having a first face and an opposing second face, wherein the first face of the first die is physically coupled with the surface of the package substrate, and wherein the first die includes a first radiative element; and
    a second die having a third face and an opposing fourth face, wherein the third face of the second die is physically coupled with the second face of the first die, wherein the second die includes a second radiative element communicatively coupled by a communication path with the first radiative element, wherein the communication path is perpendicular to the surface of the package substrate between the second face of the first die and the third face of the second die, first die is configured to transmit an electromagnetic signal with a frequency of at least 20 gigahertz (GHz) from the first radiative element to the second radiative element.

11. The electronic device of claim 10, wherein the first die is coupled with the package substrate by solder.

12. The electronic device of claim 10, wherein the first die is coupled with the second die, by solder.

13. The electronic device of claim 10, wherein the first radiative element and the second radiative element are a directional coupler.

14. The electronic device of claim 10, wherein the first radiative element and the second radiative element are a capacitor or a transformer.

15. The electronic device of claim 10, wherein the first radiative element is a first antenna and the second radiative element is a second antenna.

16. A method of manufacturing a multi-chip microelectronic package, the method comprising:
coupling a first die to a surface of a package substrate, wherein the first die has a first radiative element, at a first face, configured to emit an electromagnetic signal with a frequency of at least 20 gigahertz (GHz); and
coupling a second die to the surface of the package substrate or to the first die, wherein the second die has a second radiative element, at a second face, configured to receive the electromagnetic signal, wherein the second die is coupled with the second face of the second die facing the first face of the first die forming a communication path between the first radiative element at the first face and the second radiative element at the second face, and wherein the first radiative element and the second radiative element are not directly physically coupled with one another.

17. The method of claim 16, wherein:
coupling the first die to the package substrate includes physically coupling the first die directly to the surface of the package substrate; and
coupling the second die includes physically coupling the second die directly to the surface of the package substrate adjacent to the first die, wherein the communication path is parallel to the surface of the package substrate between the first face of the first die and the second face of the second die.

18. The method of claim 16, wherein coupling the second die includes physically coupling the second die to the first die with the first die is positioned between the surface of the package substrate and the second die, wherein the communication path is perpendicular to the surface of the package substrate between the first face of the first die and the second face of the second die.

19. The method of claim 16, wherein the electromagnetic signal has a frequency of at least 300 GHz.

20. The method of claim 16, wherein the electromagnetic signal has a frequency of at least 1 terahertz (THz).

* * * * *

UNITED STATES PATENT AND TRADEMARK OFFICE
CERTIFICATE OF CORRECTION

PATENT NO. : 11,581,272 B2
APPLICATION NO. : 16/394537
DATED : February 14, 2023
INVENTOR(S) : Henning Braunisch et al.

It is certified that error appears in the above-identified patent and that said Letters Patent is hereby corrected as shown below:

In the Claims

In Column 12, Claim 5, Line 24, delete "wherein a face" and insert -- wherein --, therefor.

In Column 12, Claim 6, Line 27, delete "wherein a face" and insert -- wherein --, therefor.

In Column 12, Claim 10, Line 57, delete "first die" and insert -- and wherein the first die --, therefor.

In Column 12, Claim 12, Line 64, delete "die," and insert -- die --, therefor.

Signed and Sealed this
Twenty-first Day of March, 2023

Katherine Kelly Vidal
*Director of the United States Patent and Trademark Office*